United States Patent
Chang et al.

(10) Patent No.: US 11,264,962 B2
(45) Date of Patent: Mar. 1, 2022

(54) FULLY DIFFERENTIAL AMPLIFIER INCLUDING FEEDFORWARD PATH

(71) Applicant: SAMSUNG ELECTRONICS CO., LTD., Suwon-si (KR)

(72) Inventors: Jisoo Chang, Seoul (KR); Wonjun Jung, Seoul (KR); Byeongwan Ha, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 108 days.

(21) Appl. No.: 15/930,877

(22) Filed: May 13, 2020

(65) Prior Publication Data
US 2021/0104986 A1    Apr. 8, 2021

(30) Foreign Application Priority Data
Oct. 7, 2019    (KR) .......................... 10-2019-0123964

(51) Int. Cl.
*H03F 3/45* (2006.01)
*H03F 3/26* (2006.01)

(52) U.S. Cl.
CPC .......... *H03F 3/45475* (2013.01); *H03F 3/265* (2013.01); *H03F 3/45183* (2013.01); *H03F 3/45636* (2013.01); *H03F 2203/45022* (2013.01); *H03F 2203/45026* (2013.01); *H03F 2203/45072* (2013.01); *H03F 2203/45338* (2013.01)

(58) Field of Classification Search
CPC .................................................... H03F 3/4547
See application file for complete search history.

(56) References Cited

U.S. PATENT DOCUMENTS

| | | | |
|---|---|---|---|
| 6,218,901 B1 * | 4/2001 | Lukes ................... | H03F 3/3028 330/258 |
| 6,417,728 B1 * | 7/2002 | Baschirotto ......... | H03F 3/45183 330/258 |
| 6,426,676 B1 | 7/2002 | Kuijk | |
| 6,567,950 B1 | 5/2003 | Bertin et al. | |
| 7,834,696 B2 | 11/2010 | Giotta et al. | |
| 8,890,611 B2 | 11/2014 | Tsai et al. | |
| 9,401,694 B2 | 7/2016 | Peng et al. | |
| 2008/0238546 A1 * | 10/2008 | Kim ...................... | H03F 3/3022 330/257 |

(Continued)

FOREIGN PATENT DOCUMENTS

| | | |
|---|---|---|
| JP | 2006-148775 | 6/2006 |
| JP | 2013-005149 | 1/2013 |

*Primary Examiner* — Patricia T Nguyen
(74) *Attorney, Agent, or Firm* — F. Chau & Associates, LLC

(57) ABSTRACT

A fully differential amplifier includes: an input stage comprising a first amplification circuit and a second amplification circuit, one of which is configured to generate a push signal and the other of which is configured to generate a pull signal, each by amplifying a differential input signal; an output stage for generating a differential output signal based on the push signal and the pull signal; and a feedback circuit for providing common mode feedback to the first amplification circuit based on the differential output signal, wherein the second amplification circuit may include a passive network for setting a common mode voltage of the push signal or the pull signal.

20 Claims, 12 Drawing Sheets

(56) References Cited

U.S. PATENT DOCUMENTS

| | | | |
|---|---|---|---|
| 2010/0164623 A1* | 7/2010 | Jang | H03F 3/245 330/253 |
| 2014/0197887 A1* | 7/2014 | Hovesten | H03F 3/45188 330/255 |
| 2019/0296756 A1* | 9/2019 | Ali | H03M 1/002 |
| 2020/0005882 A1* | 1/2020 | Zabroda | G11C 27/026 |

* cited by examiner

FULLY DIFFERENTIAL AMPLIFIER INCLUDING FEEDFORWARD PATH

CROSS-REFERENCE TO RELATED APPLICATION

This application claims priority under 35 U.S.C. § 119 to Korean Patent Application No. 10-2019-0123964, filed on Oct. 7, 2019, in the Korean Intellectual Property Office, the disclosure of which is incorporated by reference herein in its entirety.

TECHNICAL FIELD

The inventive concept relates to a fully differential amplifier, and more particularly, to a fully differential amplifier including a feedforward path.

DISCUSSION OF RELATED ART

Integrated circuits may be increasingly specified to have high efficiency, such as a small area and low power consumption, while providing desired performance. Integrated circuits that process analog signals may include multiple amplifiers, thus amplifiers having a small area and low power consumption while providing high performance are preferred. For example, an amplifier for processing an analog signal used for wireless communication requires not only a wide bandwidth, due to a wide channel bandwidth, but also a small area and low power consumption for use in a portable communication device such as a user terminal.

SUMMARY

Exemplary embodiments of the inventive concept provide a fully differential amplifier having a wide bandwidth and low power consumption.

According to an exemplary embodiment of the inventive concept, a fully differential amplifier includes an input stage comprising a first amplification circuit and a second amplification circuit, one of which is configured to generate a push signal and the other of which is configured to generate a pull signal, each by amplifying a differential input signal, an output stage for generating a differential output signal based on the push signal and the pull signal, and a feedback circuit for providing common mode feedback to the first amplification circuit based on the differential output signal, wherein the second amplification circuit may include a passive network for setting a common mode voltage of the push signal or the pull signal.

According to an exemplary embodiment of the inventive concept, a fully differential amplifier includes an input stage for generating a first amplified signal and a second amplified signal from a differential input signal, and an output stage for generating a differential output signal based on a push-pull operation according to the first amplified signal and the second amplified signal, wherein the input stage may include a first amplification circuit for generating a first amplified signal based on common mode feedback generated from the differential output signal, and a second amplification circuit for generating a second amplified signal having a common mode voltage which is set based on a bias and a passive network.

According to an exemplary embodiment of the inventive concept, a fully differential amplifier includes an input stage including a first amplification circuit and a second amplification circuit respectively generating a first amplified signal and a second amplified signal from a differential input signal, and an output stage for generating a differential output signal based on a push-pull operation according to the first amplified signal and the second amplified signal, wherein the first amplification circuit may generate the first amplified signal based on common mode feedback generated from the differential output signal, and the second amplification circuit may include a first resistor and a second resistor connected in series with each other between differential output nodes of the second amplified signal and configured to provide a bias voltage for a common mode voltage of the second amplified signal.

BRIEF DESCRIPTION OF THE DRAWINGS

Exemplary embodiments of the inventive concept will be more clearly understood from the following detailed description when taken in conjunction with the accompanying drawings, in which.

DETAILED DESCRIPTION

Figure 1:
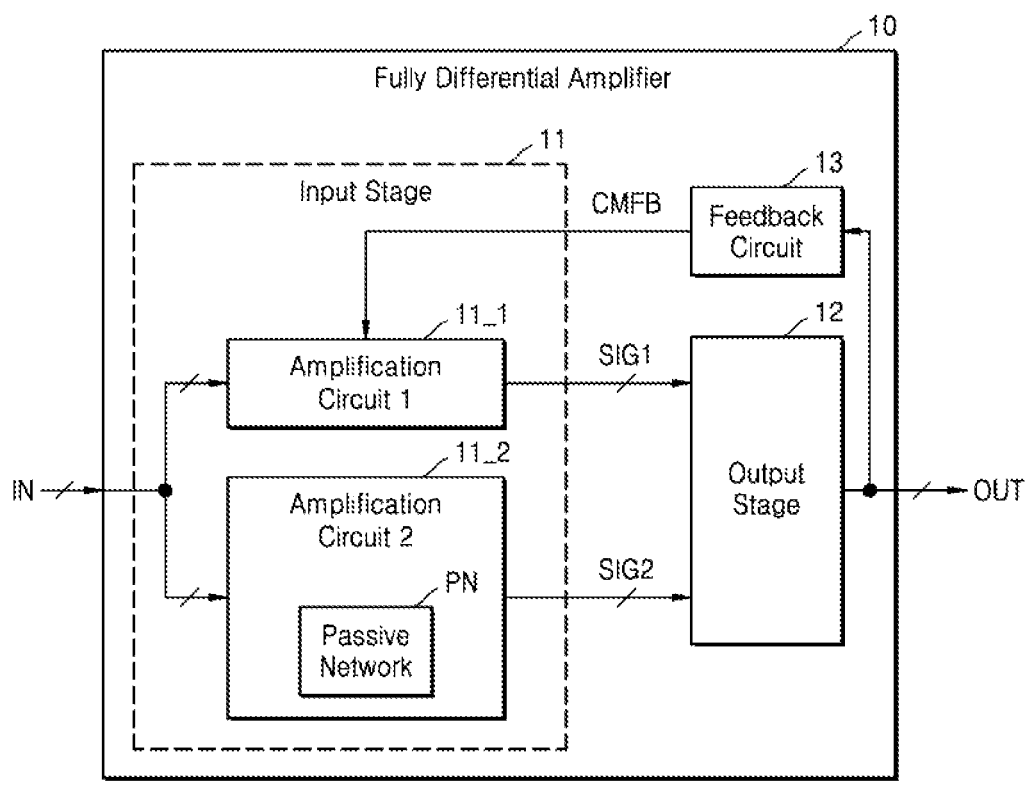
FIG. 1 is a schematic block diagram illustrating an exemplary amplifier according to an embodiment of the inventive concept.

As shown in FIG. 1, an exemplary amplifier according to an embodiment is indicated generally by the reference numeral 10. In detail, the fully differential amplifier 10 generates an output signal OUT, which is a differential signal, by amplifying an input signal IN, which is also a differential signal. In some embodiments, the fully differential amplifier 10 may be manufactured by a semiconductor process and included in one die. In some embodiments, the fully differential amplifier 10 may be implemented in one semiconductor package or as a portion of an integrated circuit included in one semiconductor package. As shown in FIG. 1, the fully differential amplifier 10 may include an input stage 11, an output stage 12, and a feedback circuit 13. In some embodiments, the fully differential amplifier 10 may be referred to as a two-stage amplifier.

The input stage 11 may receive the input signal IN as a differential signal, and may provide a first amplified signal SIG1 and a second amplified signal SIG2 to the output stage 12. As shown in FIG. 1, the input stage 11 may include a first amplification circuit 11_1 and a second amplification circuit 11_2, wherein the first amplification circuit 11_1 and the second amplification circuit 11_2 may respectively generate the first amplified signal SIG1 and the second amplified signal SIG2, which are differential signals, by amplifying the input signal IN. The first amplification circuit 11_1 may receive common mode feedback CMFB from the feedback circuit 13, and may set a common mode level (or common mode voltage) of the first amplified signal SIG1 based on the common mode feedback CMFB. In addition, the second amplification circuit 11_2 may include a passive network PN for setting a common mode level of the second amplified signal SIG2, and the passive network PN may include at least one passive device, such as a resistor and/or a capacitor. Examples of the first amplification circuit 11_1 and the second amplification circuit 11_2 will be described below with reference to FIGS. 4 and 5. The input stage 11 may be referred to herein as the first stage of the fully differential amplifier 10.

The output stage 12 may receive the first amplified signal SIG1 and the second amplified signal SIG2 as differential signals, and may generate the output signal OUT that is a differential signal. In some embodiments, the output stage 12 may generate the output signal OUT based on a push-pull operation (i.e., an operation of pushing or pulling current) according to the first amplified signal SIG1 and the second amplified signal SIG2. For example, when the first amplified signal SIG1 is a push signal for controlling a push operation, the second amplified signal SIG2 may be a pull signal for controlling a pull operation, and when the first amplified signal SIG1 is a pull signal, the second amplified signal SIG2 may be a push signal. Accordingly, when the input signal IN is a voltage signal, the fully differential amplifier 10 may be referred to as an operational transconductance amplifier (OTA). An example of the output stage 12 will be described below with reference to FIG. 2, where the output stage 12 may be referred to as a second stage of the fully differential amplifier 10.

The feedback circuit 13 may receive the output signal OUT generated from the output stage 12, and may generate the common mode feedback CMFB from the output signal OUT and provide the same to the input stage 11. The common mode feedback CMFB may be used in the fully differential amplifier 10 to set a common mode (or average) level of the output signal OUT, which is a differential signal. For example, the common mode feedback CMFB may keep the common mode level close to a halfway between supply voltages, that is, a positive supply voltage VDD and a negative supply voltage (or a ground potential).

The first amplification circuit 11_1, the output stage 12, and the feedback circuit 13 may configure a feedback-based amplification path, while the second amplification circuit 11_2 and the output stage 12 may configure a feedforward-based amplification path. Such a feedforward structure (or feedforward compensation) may add negative zeros and provide a wide bandwidth of the fully differential amplifier 10. In this specification, a path through which the input signal IN is amplified through the second amplification circuit 11_2 and the output stage 12 may be referred to as a feedforward path.

The passive network PN of the second amplification circuit 11_2 may include resistors having relatively high resistance, as described below with reference to FIGS. 6A and 6B, thus providing a high open-loop gain of the fully differential amplifier 10. As a result, the fully differential amplifier 10 may have a wide gain-bandwidth product GBW. In addition, as will be described below with reference to FIGS. 4 and 5, a cascade structure is unnecessary in the first amplification circuit 11_1 and the second amplification circuit 11_2, thereby using a low power supply voltage. Accordingly, a reduction in power consumption of the fully differential amplifier 10 may be achieved. In addition, the use of a single feedback circuit 13 may simplify the structure of the fully differential amplifier 10 and further reduce the area and power consumption of the fully differential amplifier 10.

Figure 2:
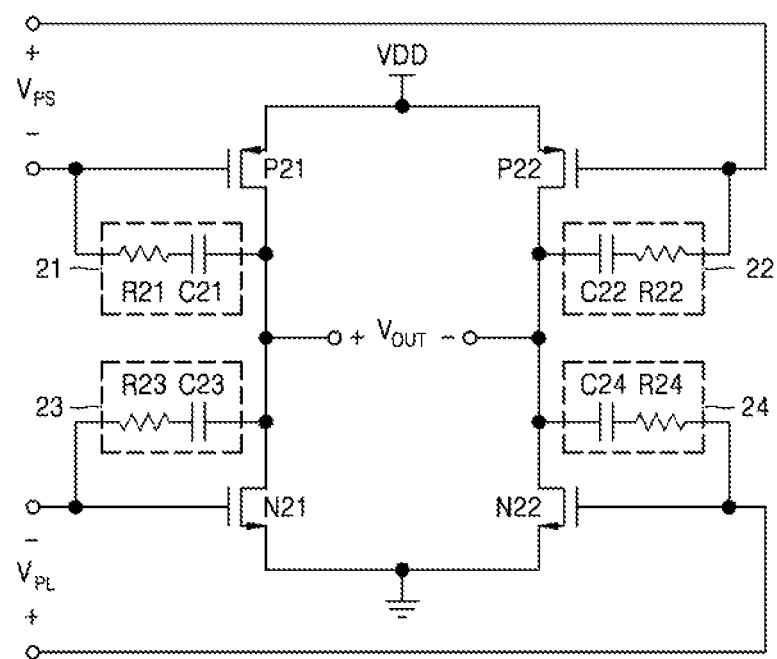
FIG. 2 is a circuit diagram illustrating an exemplary output stage according to an embodiment of the inventive concept.

Turning to FIG. 2, an exemplary output stage according to an embodiment is indicated generally by the reference numeral 20. As described above with reference to FIG. 1, an output stage may generate the output signal OUT based on a push-pull operation. In the output stage 20 of FIG. 2, a push signal controlling a push operation may be a push voltage $V_{PS}$, and a pull signal controlling a pull operation may be a pull voltage $V_{PL}$. An output voltage $V_{OUT}$ may be generated according to a load connected to the output stage 20. As shown in FIG. 2, each of the push voltage $V_{PS}$, the pull voltage $V_{PL}$, and the output voltage $V_{OUT}$ may be differential signals. It shall be understood that the output stage 12 of FIG. 1 is not limited to the output stage 20 of FIG. 2. Hereinafter, for descriptive purposes, FIG. 2 may be described with reference to FIG. 1.

Referring to FIG. 2, the output stage 20 may include a plurality of transistors P21, P22, N21, and N22. The transistors may be Bipolar Junction Transistors (BJTs), but are not limited thereto. The transistors may be an enhancement mode type of field-effect transistor (FET), such as metal-oxide semiconductor field-effect transistor (MOSFET), but are not limited thereto. For example, the first n-channel field effect transistor (NFET) N21 and the second NFET N22 may receive the pull voltage $V_{PL}$. The first NFET N21 and the second NFET N22 may pull current from output nodes between which the differential output voltage $V_{OUT}$ is generated, in response to the pull voltage $V_{PL}$. In addition, the first p-channel field effect transistor (PFET) P21 and the second PFET P22 may push current to the differential output nodes at which the output voltage $V_{OUT}$ is generated, in response to the push voltage $V_{PS}$.

The output stage 20 may include first to fourth RC branches 21, 22, 23 and 24. For example, the first RC branch 21 may include a first resistor R21 and a first capacitor C21 connected in series with each other, and may be connected between a gate and a drain of the first PFET P21. The second RC branch 22 may include a second resistor R22 and a second capacitor C22 connected in series with each other, and may be connected between a gate and a drain of the second PFET P22. The third RC branch 23 may include a third resistor R23 and a third capacitor C23 connected in series with each other, and may be connected between a gate and a drain of the first NFET N21. The fourth RC branch 24 may include a fourth resistor R24 and a fourth capacitor C24 connected in series with each other, and may be connected between a gate and a drain of the second NFET N22. The first to fourth RC branches 21 to 24 may add negative zeros in the fully differential amplifier 10. In some embodiments, the resistor and capacitor included in each of the first to fourth RC branches 21 to 24 may be a variable resistor and a variable capacitor, and may be tuned to have specific resistance and capacitance in a manufacturing process of the fully differential amplifier 10, respectively. The capacitors C21, C22, C23 and C23 may be MOS capacitors, but are not limited thereto.

Figure 3:
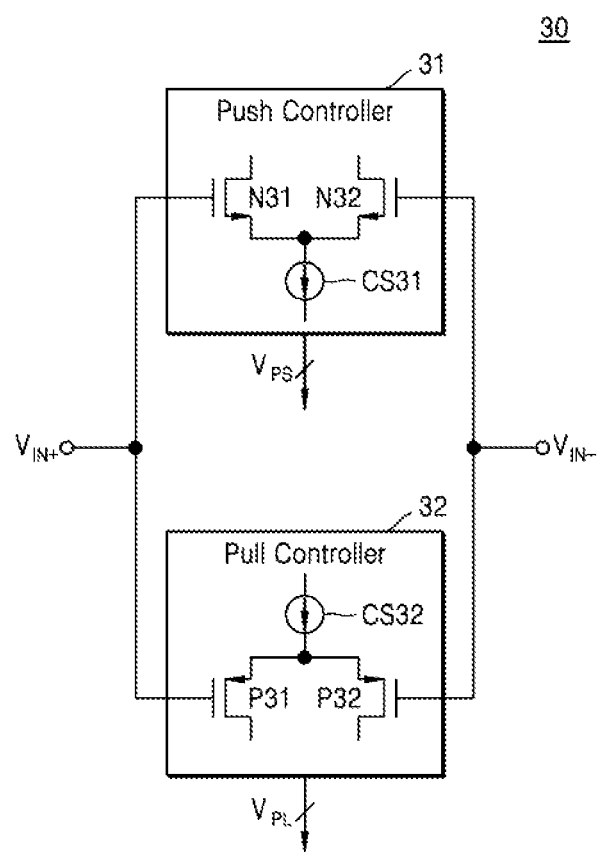
FIG. 3 is a circuit diagram illustrating exemplary an input stage according to an embodiment of the inventive concept.

Turning now to FIG. 3, an exemplary input stage according to an embodiment is indicated generally by the reference numeral 30. As described above with reference to FIG. 1, an input stage 30 of FIG. 3 may generate the first amplified signal SIG1 and the second amplified signal SIG2 by amplifying the input signal IN. The first amplified signal SIG1 and the second amplified signal SIG2 may correspond to different ones of a push signal and a pull signal, respectively. In the input stage 30, the input signal IN, as a differential signal, may include complementary voltages $V_{IN+}$ and $V_{IN-}$, and the complementary voltages $V_{IN+}$ and $V_{IN-}$ may define an input voltage $V_{IN}$ (where $V_{IN}=V_{IN+}-V_{IN-}$). In addition, as described above with reference to FIG. 2, the input stage 30 may generate the push voltage $V_{PS}$ and the pull voltage $V_{PL}$ as the push signal and the pull signal, wherein the push voltage $V_{PS}$ and the pull voltage $V_{PL}$ may be differential signals. It shall be understood that the input stage 11 of FIG. 1 is not limited to the input stage 30 of FIG. 3. Hereinafter, for descriptive purposes, FIG. 3 may be described with reference to FIG. 1 such that duplicate description may be omitted.

Referring to FIG. 3, the input stage 30 may include a push controller 31 and a pull controller 32. The push controller 31 may generate the push voltage $V_{PS}$ by amplifying the input voltage $V_{IN}$, and the pull controller 32 may generate the pull voltage $V_{PL}$ by amplifying the input voltage $V_{IN}$. In some embodiments, the first amplification circuit 11_1 or the second amplification circuit 11_2 included in the input stage 11 of FIG. 1 may function as the push controller 31 or the pull controller 32. For example, the push controller 31 and the pull controller 32 may correspond to the first amplification circuit 11_1 and the second amplification circuit 11_2 of FIG. 1, respectively, or may correspond to the second amplification circuit 11_2 and the first amplification circuit 11_1 of FIG. 1, respectively.

The push controller 31 may include a first NFET N31 and a second NFET N32 that receive the input voltage $V_{IN}$. That is, the push controller 31 that generates the push voltage $V_{PS}$ may include an NFET input differential pair as transistors that receive the input voltage $V_{IN}$. In addition, the push controller 31 may further include a first current source CS31 that provides a bias current to the first NFET N31 and the second NFET N32. The first current source CS31 may operate independently of a second current source CS32 of the pull controller 32 described below, and accordingly, the first NFET N31 and the second NFET N32 of the push controller 31 may be biased independently of the pull controller 32.

The pull controller 32 may include a first PFET P31 and a second PFET P32 that receive the input voltage $V_{IN}$. That is, the pull controller 32 generating the pull voltage $V_{PL}$ may include a PFET input differential pair as transistors that receive the input voltage $V_{IN}$. In addition, the pull controller 32 may further include the second current source CS32 that provides a bias current to the first PFET P31 and the second PFET P32. The second current source CS32 may operate independently of the first current source CS31 of the push controller 31. Accordingly, the first PFET P31 and the second PFET P32 of the pull controller 32 may be biased independently of the push controller 31. In some embodiments, the first current source CS31 and the second current source CS32 may generate bias currents of adjusted magnitude to balance a push-pull operation at the output stage 12.

As shown in FIG. 3, the input voltage $V_{IN}$ may be applied to the NFET input differential pair (i.e., N31 and N32) of the push controller 31 and the PFET input differential pair (i.e., P31 and P32) of the pull controller 32. Accordingly, the fully differential amplifier 10 including the input stage 30 may handle the rail-to-rail input voltage $V_{IN}$, and consequently may have high usability.

Figure 4:
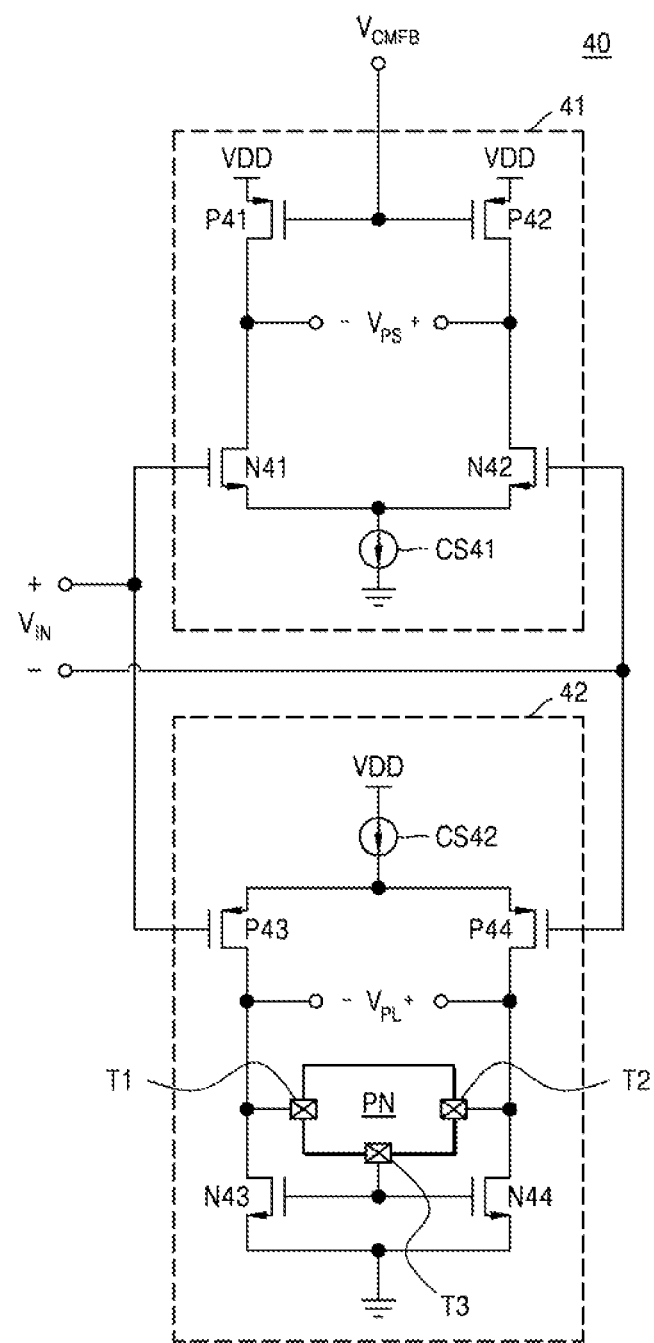
FIG. 4 is a circuit diagram illustrating an exemplary input stage according to an embodiment of the inventive concept.

As shown in FIG. 4, an exemplary input stage according to an embodiment of the inventive concept is indicated generally by the reference numeral 40. In more detail, the circuit diagram of FIG. 4 shows an example in which the first amplification circuit 11_1 of FIG. 1 controls the push operation of the output stage 12 and the second amplification circuit 11_2 controls the pull operation of the output stage 12.

Figure 5:
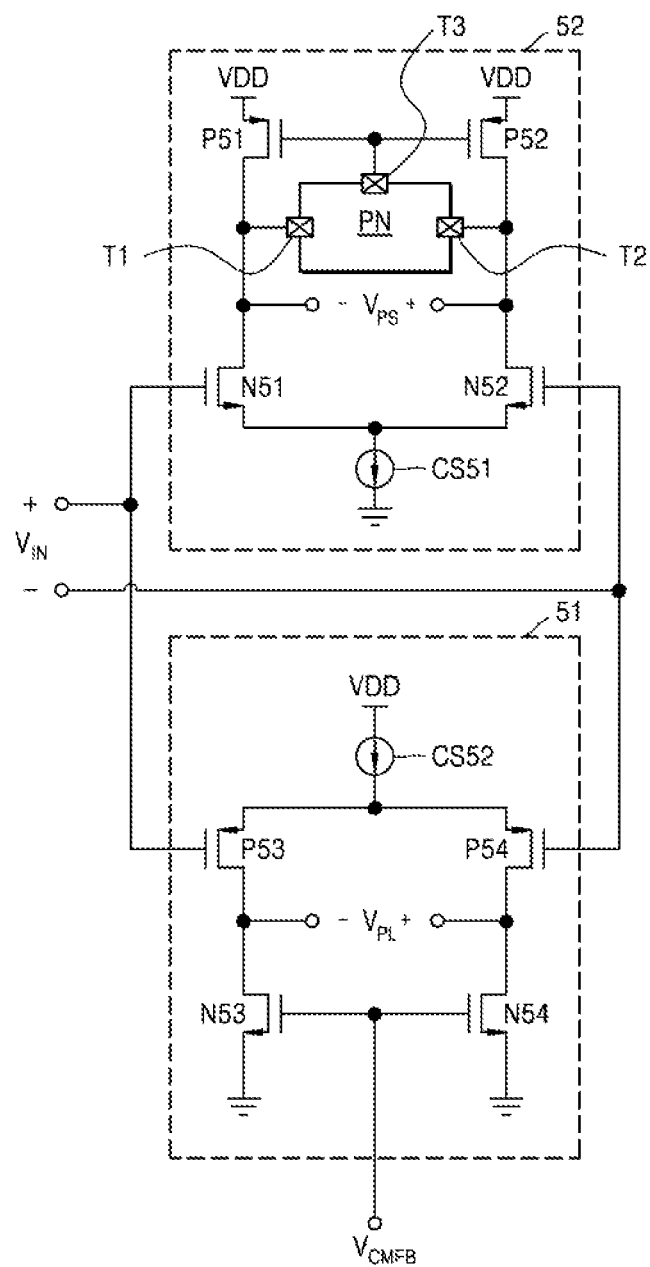
FIG. 5 is a circuit diagram illustrating an exemplary input stage according to an embodiment of the inventive concept.

Turning to FIG. 5, an exemplary input stage according to an embodiment of the inventive concept is indicated generally by the reference numeral 50. The circuit diagram of FIG. 5 shows an example in which the first amplification circuit 11_1 of FIG. 1 controls the pull operation of the output stage 12 and the second amplification circuit 11_2 controls the push operation of the output stage 12.

That is, the first amplified signal SIG1 and the second amplified signal SIG2 of FIG. 1 may correspond to the push voltage $V_{PS}$ and the pull voltages $V_{PL}$ in the circuit diagram of FIG. 4, respectively; or may correspond to the pull voltage $V_{PL}$ and the push voltage $V_{PS}$ in the circuit diagram of FIG. 5, respectively. It shall be understood that FIG. 1 is not limited to these embodiments. Hereinafter, for descriptive purposes, FIGS. 4 and 5 may be described with reference to FIG. 1 such that duplicate description may be omitted.

Referring to FIG. 4, an input stage 40 may include a first amplification circuit 41 and a second amplification circuit 42. The first amplification circuit 41 may generate the differential push voltage $V_{PS}$ by amplifying the differential input voltage $V_{IN}$. As shown in FIG. 4, the first amplification circuit 41 may include a first NFET N41, a second NFET N42, a first PFET P41, a second PFET P42, and a first current source CS41. The first NFET N41 and the second NFET N42 may receive the differential input voltage $V_{IN}$ and may be biased by a bias current generated by the first current source CS41. The first PFET P41 and the second PFET P42 may be connected to the first NFET N41 and the second NFET N42, respectively, and may have gates connected with each other. The common mode feedback voltage (CMFB) $V_{CMFB}$, as the common mode feedback CMFB of FIG. 1, may be applied to the gates of the first PFET P41 and the second PFET P42. Accordingly, a common mode voltage of the differential push voltage $V_{PS}$ generated between drains of the first PFET P41 and the second PFET P42 may be set by a CMFB voltage $V_{CMFB}$.

The second amplification circuit 42 may generate the differential pull voltage $V_{PL}$ by amplifying the differential input voltage $V_{IN}$. As shown in FIG. 4, the second amplification circuit 42 may include a third PFET P43, a fourth PFET P44, a third NFET N43, a fourth NFET N44, and a second current source CS42, and may further include the passive network PN. The third PFET P43 and the fourth PFET P44 may receive the differential input voltage $V_{IN}$ and may be biased by a bias current generated by the second current source CS42. The third NFET N43 and the fourth NFET N44 may be connected to the third PFET P43 and the fourth PFET P44, respectively, and may have gates connected with each other.

The passive network PN may include a first terminal T1, a second terminal T2, and a third terminal T3. The first terminal T1 may be connected to the third NFET N43 drain and the third PFET P43 drain, the second terminal T2 may be connected to the fourth NFET N44 drain and the fourth PFET P44 drain, and the third terminal T3 may be commonly connected to the gates of the third NFET N43 and the fourth NFET N44. As shown in FIG. 4, the differential pull voltage $V_{PL}$ may be generated between drains of the third NFET N43 and the fourth NFET N44, and thus, the first terminal T1 and the second terminal T2 of the passive network PN may be connected to differential output nodes of the second amplification circuit 42 for the differential pull voltage $V_{PL}$, respectively. The passive network PN may include at least one passive device, and may set voltages of the gates of the third NFET N43 and the fourth NFET N44 based on voltages of differential output nodes of the pull voltage $V_{PL}$. Accordingly, a common mode voltage of the differential pull voltage $V_{PL}$, or a DC operating point of the second amplification circuit 42, may be set by the bias current of the second current source CS42, the third NFET N43, the fourth NFET N44, and the passive network PN. An example of the passive network PN will be described below with reference to FIGS. 6A and 6B.

Referring to FIG. 5, an input stage 50 may include a first amplification circuit 51 and a second amplification circuit 52. The first amplification circuit 51 may generate the differential pull voltage $V_{PL}$ by amplifying the differential input voltage $V_{IN}$. As shown in FIG. 5, the first amplification circuit 51 may include a third PFET P53, a fourth PFET P54, a third NFET N53, a fourth NFET N54, and a second current source CS52. The third PFET P53 and the fourth PFET P54 may receive the differential input voltage $V_{IN}$ and may be biased by a bias current generated by the second current source CS52. The third NFET N53 and the fourth NFET N54 may be connected to the third PFET P53 and the fourth PFET P54, respectively, and may have gates connected with each other. The CMFB voltage $V_{CMFB}$ as the common mode feedback CMFB of FIG. 1 may be applied to the gates of the third NFET N53 and the fourth NFET N54. Accordingly, the common mode voltage of the pull voltage $V_{PL}$ generated between drains of the third NFET N53 and the fourth NFET N54 may be set by the CMFB voltage $V_{CMFB}$.

The second amplification circuit 52 may generate the differential push voltage $V_{PS}$ by amplifying the differential input voltage $V_{IN}$. As shown in FIG. 5, the second amplification circuit 52 may include a first NFET N51, a second NFET N52, a first PFET P51, a second PFET P52, and a first current source CS51, and may further include the passive network PN. The first NFET N51 and the second NFET N52 may receive the differential input voltage $V_{IN}$ and may be biased by a bias current generated by the first current source CS51. The first PFET P51 and the second PFET P52 may be connected to the first NFET N51 and the second NFET N52, respectively, and may have gates connected with each other.

The passive network PN may include the first terminal T1, the second terminal T2, and the third terminal T3. The first terminal T1 may be connected to the first NFET N51 drain and the first PFET P51 drain, the second terminal T2 may be connected to the second NFET N52 drain and the second PFET P52 drain, and the third terminal T3 may be commonly connected to the gates of the first PFET P51 and the second PFET P52. As shown in FIG. 5, the differential push voltage $V_{PS}$ may be generated between the drains of the first PFET P51 and the second PFET P52, and thus, the first terminal T1 and the second terminal T2 of the passive network PN may be connected to differential output nodes of the second amplification circuit 52 for the differential push voltage $V_{PS}$, respectively. The passive network PN may include at least one passive device, and may set voltages of the gates of the first PFET P51 and the second PFET P52 based on voltages of the differential output nodes of the differential push voltage $V_{PS}$. Accordingly, a common mode voltage of the differential push voltage $V_{PS}$, or a DC operating point of the second amplification circuit 52, may be set by a bias current of the first current source CS41, the first PFET P51, the second PFET P52, and the passive network PN.

Figure 6A:
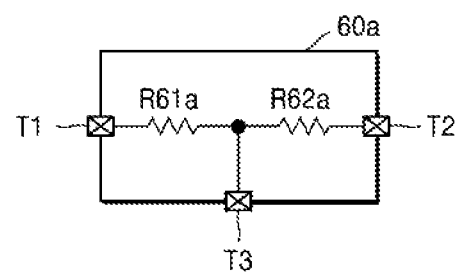
FIG. 6A is a circuit diagram illustrating an exemplary passive network according to an embodiment of the inventive concept.

Turning now to FIG. 6A, an exemplary passive network according to an embodiment of the inventive concept is indicated generally by the reference numeral 60a. In more detail, the passive network 60a includes the first terminal T1, the second terminal T2, and the third terminal T3, as described above with reference to FIGS. 4 and 5, but is not limited thereto. The first terminal T1 and the second terminal T2 of the passive network 60a may be connected to differential output nodes of the second amplified signal SIG2 generated by the second amplification circuit 11_2 of FIG. 1, respectively, as described above with reference to FIGS. 4 and 5, but is not limited thereto. The voltage at the third terminal T3 of the passive network 60a may contribute to setting a common mode level of the second amplified signal SIG2.

Figure 6B:
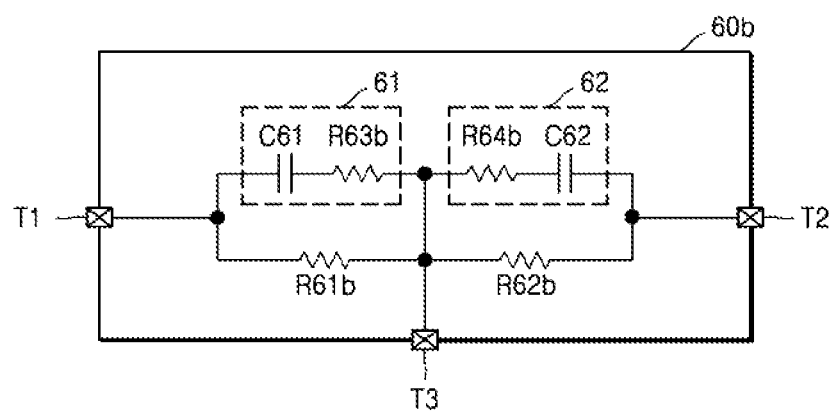
FIG. 6B is a circuit diagram illustrating an exemplary passive network according to an embodiment of the inventive concept.

Turning now to FIG. 6B, an exemplary passive network according to an embodiment of the inventive concept is indicated generally by the reference numeral 60b. In more detail, the passive network 60b includes the first terminal T1, the second terminal T2, and the third terminal T3, as described above with reference to FIGS. 4 and 5, but is not limited thereto. The first terminal T1 and the second terminal T2 of the passive network 60b may be connected to differential output nodes of the second amplified signal SIG2 generated by the second amplification circuit 11_2 of FIG. 1, respectively, as described above with reference to FIGS. 4 and 5, but is not limited thereto. The voltage at the third terminal T3 of the passive network 60b may contribute to setting a common mode level of the second amplified signal SIG2.

Hereinafter, FIGS. 6A and 6B will be described with reference to FIG. 4. In the description of FIGS. 6A and 6B, it is assumed that the passive network PN of FIG. 4 has the same structure as that of the passive network 60a of FIG. 6A or the passive network 60b of FIG. 6B. It shall be understood that the passive network PN of FIG. 4 is not limited thereto.

Referring to FIG. 6A, the passive network 60a may include a first resistor R61a and a second resistor R62a. The first resistor R61a and the second resistor R62a may be connected in series with each other between the first terminal T1 and the second terminal T2, and may be commonly connected to the third terminal T3. The first resistor R61a and the second resistor R62a may have high resistance, such as, for example, several tens of kΩ. Due to the high resistance of the first resistor R61a and the second resistor R62a, a high open loop gain may be achieved. When output resistance (or drain-source resistance) of the third PFET P43 and the fourth PFET P44 of FIG. 4 is $r_P$, output resistance (or drain-source resistance) of the third NFET N43 and the fourth NFET N44 of FIG. 4 is $r_N$, and resistance of the first resistor R61a and the second resistor R62a is $R_O$, output resistance at one of the differential output nodes of the differential pull voltage $V_{PL}$ may correspond to '$r_P//r_N//R_O$'=$r_Pr_NR_O/(r_NR_O+r_PR_O+r_Pr_N)$.

Referring to FIG. 6B, the passive network 60b may include a first resistor R61b and a second resistor R62b, similar to the passive network 60a of FIG. 6A, and may further include a first RC branch 61 and a second RC branch 62. As illustrated in FIG. 6B, the first RC branch 61 may include a third resistor R63b and a first capacitor C61 connected in series with each other, and may be connected in parallel with the first resistor R61b. In addition, the second RC branch 62 may include a fourth resistor R64b and a second capacitor C62 connected in series with each other, and may be connected in parallel with the second resistor R62b. In some embodiments, the third resistor R63b and the fourth resistor R64b may have the same resistance, and the first capacitor C61 and the second capacitor C62 may have the same capacitance. The third resistor R63b, the fourth resistor R64b, the first capacitor C61, and the second capacitor C62 may have resistances and capacitances determined based on a frequency response characteristic of the second amplification circuit 42 of an input stage, such as the input stage 40 of FIG. 4, and an input impedance of an output stage, such as the output stage 12 of FIG. 1, respectively. In some embodiments, the third resistor R63b and the fourth resistor R64b may be variable resistors, and may be tuned to have specific resistances during the manufacturing of a fully differential amplifier, such as the fully differential amplifier 10 of FIG. 1. In addition, in some embodiments, the first capacitor C61 and the second capacitor C62 may be variable capacitors, and may be tuned to have specific capacitances during the manufacturing of a fully differential amplifier, such as the fully differential amplifier 10 of FIG. 1.

Figure 7:
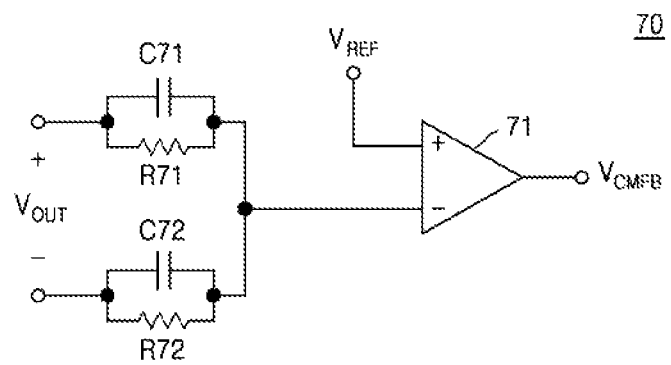
FIG. 7 is a circuit diagram illustrating an exemplary feedback circuit according to an embodiment of the inventive concept.

As shown in FIG. 7, an exemplary feedback circuit according to an embodiment is indicated generally by the reference numeral 70. As described above with reference to FIG. 1, the common mode feedback CMFB may be generated based on the output signal OUT, and the common mode feedback CMFB may be provided to the first amplification circuit 11_1. A feedback circuit 70 of FIG. 7 may receive the differential output voltage $V_{OUT}$ as the output signal OUT of FIG. 1, and may generate the CMFB voltage $V_{CMFB}$ as the common mode feedback CMFB of FIG. 1. Hereinafter, for descriptive purposes, FIG. 7 will be described with reference to FIG. 1, and it is noted that the feedback circuit 13 of FIG. 1 is not limited to the feedback circuit 70 of FIG. 7.

Referring to FIG. 7, the feedback circuit 70 may include a first resistor R71, a second resistor R72, a first capacitor C71, a second capacitor C72, and a differential amplifier 71. The first resistor R71 and the second resistor R72 may be connected in series with each other, and the first capacitor C71 and the second capacitor C72 may be connected in parallel with the first resistor R71 and the second resistor R72, respectively. In some embodiments, the first resistor R71 and the second resistor R72 may have the same resistance, and the first capacitor C71 and the second capacitor C72 may have the same capacitance. Accordingly, a common mode (or average) voltage of the output voltage $V_{OUT}$, which is the differential signal, may be applied to an inverting input of the differential amplifier 71. In some embodiments, the first resistor R71 and the second resistor R72 may be variable resistors, and may be tuned to have specific resistances during the manufacturing of the fully differential amplifier 10. In addition, in some embodiments, the first capacitor C71 and the second capacitor C72 may be variable capacitors, and may be tuned to have specific capacitances during the manufacturing of the fully differential amplifier 10.

The differential amplifier 71 may have a non-inverting input to which a reference voltage $V_{REF}$ is applied and an inverting input to which the common mode voltage of the output voltage $V_{OUT}$ is applied. The differential amplifier 71 may have any structure and generate the CMFB voltage $V_{CMFB}$ by amplifying a difference between the common mode voltage of the output voltage $V_{OUT}$ and the reference voltage $V_{REF}$. Accordingly, the common mode voltage of the output voltage $V_{OUT}$ may be adjusted to approximately match the reference voltage $V_{REF}$. In some embodiments, the reference voltage $V_{REF}$ may be close to a halfway between supply voltages, that is, the positive supply voltage VDD and the negative supply voltage (or the ground potential). The fully differential amplifier 10 may include one feedback circuit 70, thereby simplifying the structure of the fully differential amplifier 10 and further reducing the area and power consumption of the fully differential amplifier 10.

Figure 8:
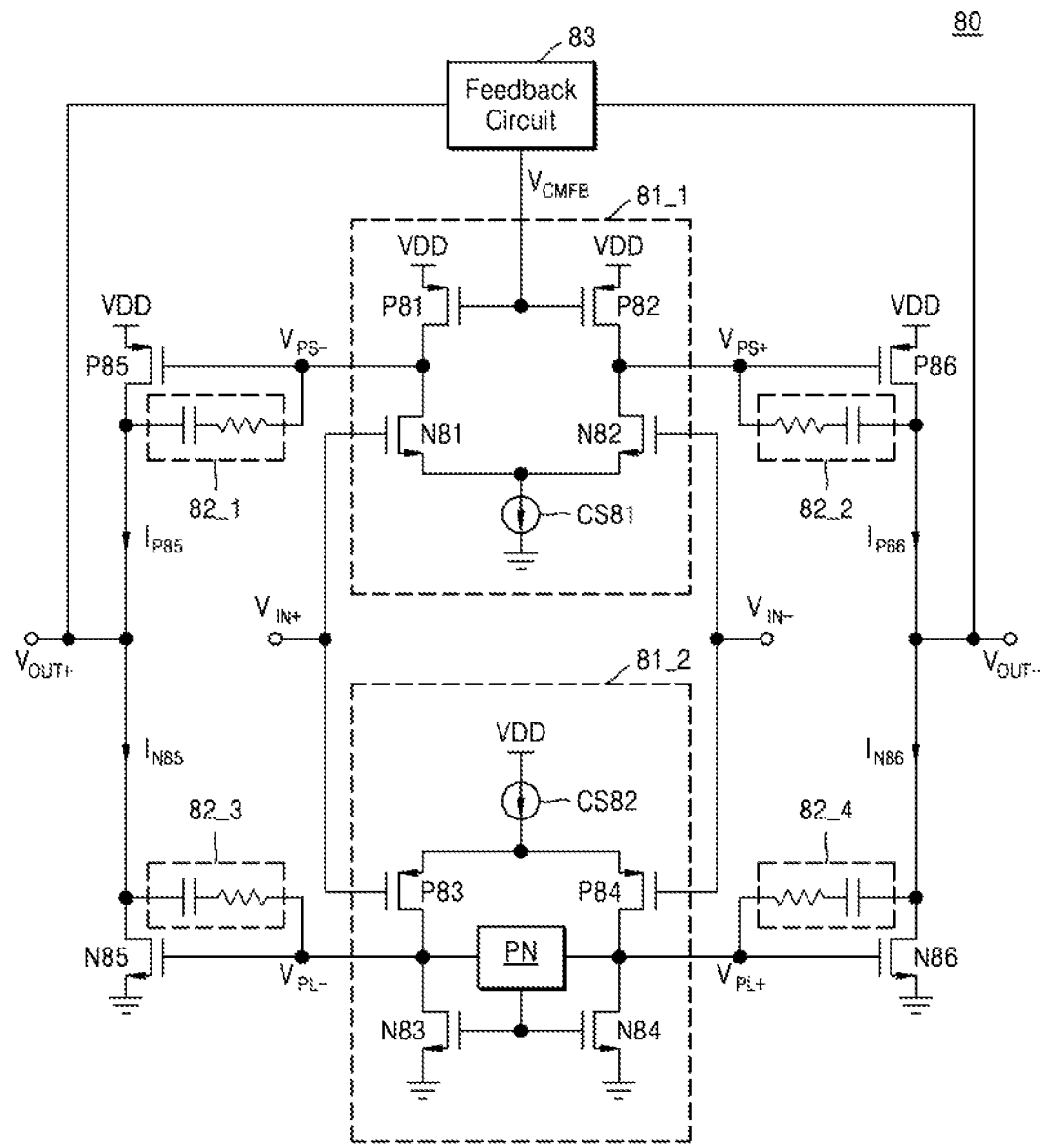
FIG. 8 is a circuit diagram illustrating an exemplary fully differential amplifier according to an embodiment of the inventive concept.

Turning to FIG. 8, an exemplary fully differential amplifier according to an embodiment is indicted generally by the reference numeral 80. In more detail, the circuit diagram of FIG. 8 shows a fully differential amplifier 80 including the output stage 20 of FIG. 2 and the input stage 40 of FIG. 4.

Figure 9A:
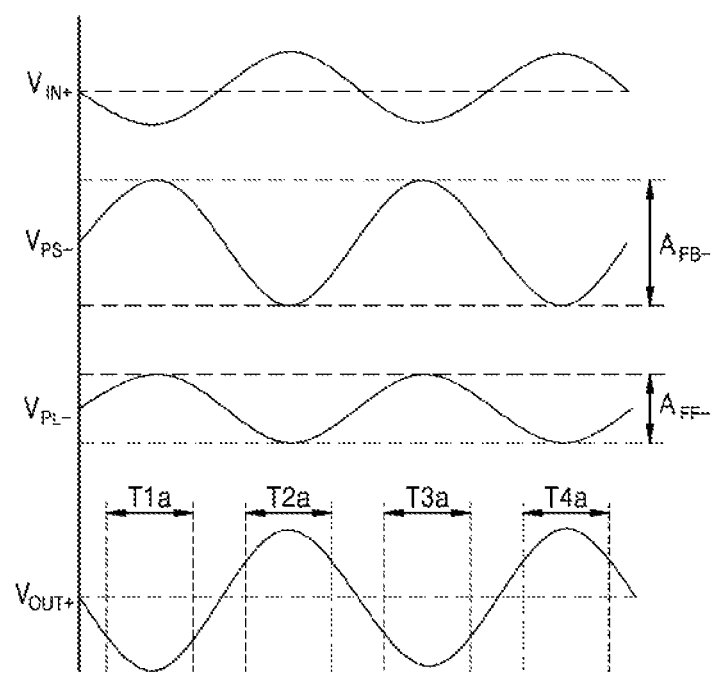
FIG. 9A is a graphical diagram illustrating exemplary operation of a fully differential amplifier according to an embodiment of the inventive concept.

Turning now to FIG. 9A, signal graphs illustrate exemplary operation of a fully differential amplifier according to an embodiment. FIG. 9A shows signals over time in the fully differential amplifier 80 of FIG. 8.

Figure 9B:
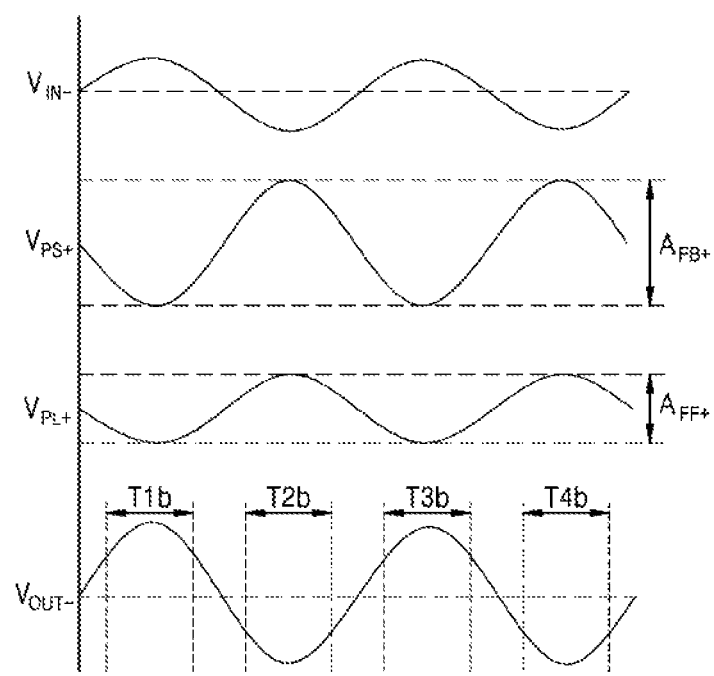
FIG. 9B is a graphical diagram illustrating exemplary operation of a fully differential amplifier according to an embodiment of the inventive concept.

Turning now to FIG. 9B, signal graphs illustrate exemplary operation of a fully differential amplifier according to an embodiment. FIG. 9B shows signals over time in the fully differential amplifier 80 of FIG. 8.

Hereinafter, for descriptive purposes, descriptions provided above in relation to FIGS. 2 and 4 may be omitted herein to avoid redundancy. It shall be understood that the embodiments are not limited thereto.

Referring to FIG. 8, the fully differential amplifier 80 may include an input stage (center), an output stage (sides), and a feedback circuit 83. The input stage may include a first amplification circuit 81_1 and a second amplification circuit 81_2, may receive the input voltage $V_{IN}(V_{IN}=V_{IN+}-V_{IN-})$ may generate the push voltage $V_{PS}(V_{PS}=V_{PS+}-V_{PS-})$, and may generate the pull voltage $V_{PL}(V_{PL}=V_{PL+}-V_{PL-})$. The output stage may include a fifth PFET P85, a sixth PFET P86, a fifth NFET N85, a sixth NFET N86, and first to fourth RC branches 82_1, 82_2, 82_3 and 82_4, and may generate the differential output voltage $V_{OUT}$ in response to the push voltage $V_{PS}$ and the pull voltage $V_{PL}$, where $V_{OUT}=V_{OUT+}-V_{OUT-}$. Each of the first to fourth RC branches 82_1 to 82_4 may include a resistor and a capacitor connected in series with each other.

The first amplification circuit 81_1 may include a first NFET N81 and a second NFET N82 that receive the input voltage $V_{IN}$, may include a first current source CS81 that generates a bias current, and may include a first PFET P81 and a second PFET P82 that receive the CMFB voltage $V_{CMFB}$ as gate voltage from the feedback circuit 83. Accordingly, the common mode voltage of the push voltage $V_{PS}$ may be set based on the CMFB voltage $V_{CMFB}$. The fifth PFET P85 and the sixth PFET P86 of the output stage may receive the push voltage $V_{PS}$ and may push current in response to the push voltage $V_{PS}$. For example, as shown in FIG. 8, the fifth PFET P85 may push current $I_{P85}$ in response to the voltage $V_{PS-}$ of a differential pair of the push voltage $V_{PS}$, and the sixth PFET P86 may push current $I_{P86}$ in response to the voltage $V_{PS+}$ of the differential pair.

The second amplification circuit 81_2 may include a third PFET P83 and a fourth PFET P84 receiving the differential input voltage $V_{IN}$, a second current source CS82 generating a bias current, and a passive network PN, and may include a third NFET N83 and a fourth NFET N84 having a gate voltage determined by the passive network PN. Accordingly, the passive network PN may contribute to setting of the common mode voltage of the pull voltage $V_{PL}$. The fifth NFET N85 and the sixth NFET N86 of the output stage may receive the pull voltage $V_{PL}$ and may pull current in response to the pull voltage $V_{PL}$. For example, as shown in FIG. 8, the fifth NFET N85 may pull the current $I_{N85}$ in response to the voltage $V_{PL-}$ of a differential pair of the pull voltage $V_{PL}$, and the sixth NFET N86 may pull current $I_{N86}$ in response to a voltage $V_{PL+}$ of the differential pair, Referring to FIG. 9A, a voltage $V_{PS-}$ and a voltage $V_{PL-}$ of FIG. 8 may be generated as shown in FIG. 9A by the voltage $V_{IN+}$ among a differential pair of the input voltage $V_{IN}$. In some embodiments, a gain of the first amplification circuit 81_1 may be greater than a gain of the second amplification circuit 81_2, so that, as shown in FIG. 9A, an amplitude $A_{FB-}$ of the voltage $V_{PS-}$ may be greater than an amplitude $A_{FF-}$ of a voltage $V_{PL-}$. By the voltage $V_{PS-}$ and the voltage $V_{PL-}$, the voltage $V_{OUT+}$ of a differential pair of the output voltage $V_{OUT}$ may be generated as shown in FIG. 9A.

Referring to FIG. 9B, a voltage $V_{PS+}$ and a voltage $V_{PL+}$ of FIG. 8 may be generated as shown in FIG. 9B by the voltage $V_{IN-}$ among the differential pair of the input voltage $V_{IN}$. In some embodiments, a gain of the first amplification circuit 81_1 may be greater than a gain of the second amplification circuit 81_2, so that, as shown in FIG. 9B, an amplitude $A_{FB+}$ of the voltage $V_{PS+}$ may be greater than an amplitude $A_{FF+}$ of the voltage $V_{PL+}$. By the voltage $V_{PS+}$ and the voltage $V_{PL+}$, the voltage $V_{OUT-}$ of the differential pair of the output voltage $V_{OUT}$ may be generated as shown in FIG. 9B.

In some embodiments, the output stage of FIG. 8 may operate similarly to a class AB and/or a class C amplifier. For example, as shown in FIG. 9A, the voltage $V_{OUT+}$ of the differential pair of the output voltage $V_{OUT}$ may be generated by current pulling, that is, the current $I_{N85}$ of FIG. 8, in a first period T1a and a third period T3a. In addition, the voltage $V_{OUT+}$ of the differential pair of the output voltage $V_{OUT}$ may be generated by current pushing, that is, the current $I_{P85}$ of FIG. 8, in a second period T2a and a fourth period T4a. Similarly, as shown in FIG. 9B, the voltage $V_{OUT-}$ of the differential pair of the output voltage $V_{OUT}$ may be generated by current pushing, that is, the current $I_{P86}$ of FIG. 8, in a first period T1b and a third period T3b. In addition, the voltage $V_{OUT-}$ of the differential pair of the output voltage $V_{OUT}$ may be generated by current pulling, that is, the current $I_{N86}$ of FIG. 8, in a second period T2b and a fourth period T4b. Thus, the fully differential amplifier 80 may drive a large amount of current to meet high slew rate requirements, but may maintain relatively high efficiency and relatively low power consumption, unlike a class A amplifier having relatively low efficiency and relatively high-power consumption.

Figure 10:
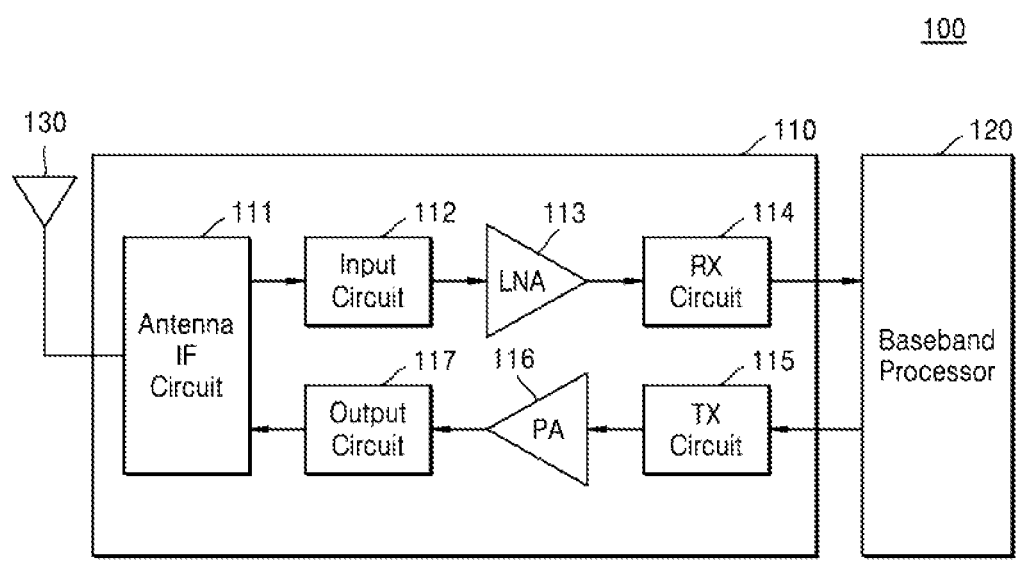
FIG. 10 is a schematic block diagram of a wireless communication device including a fully differential amplifier according to an embodiment of the inventive concept.

As shown in FIG. 10, a wireless communication device is indicated generally by the reference numeral 100, including a fully differential amplifier according to an embodiment. In the wireless communication device 100, the fully differential amplifier may be included in a transceiver 110.

In some embodiments, the wireless communication device 100 may be included in a wireless communication system using a cellular network, such as 5th generation (5G) new radio (NR), long-term evolution (LTE), or the like, and may be user equipment (UE) (or a terminal) or a base station. Further, in some embodiments, the wireless communication device 100 may connect to, for example, a wireless personal area network (WPAN) system or any other wireless communication system, unlike the wireless communication system using the cellular network. As shown in FIG. 10, the wireless communication device 100 may include the transceiver 110, a baseband processor 120, and an antenna 130.

The transceiver 110 may include an antenna interface circuit 111, and may further include a receiver including an input circuit 112, a low-noise amplifier 113, a receiving circuit 114, a transmitter including a transmitting circuit 115, a power amplifier 116, and an output circuit 117. The antenna interface circuit 111 may connect the transmitter or the receiver to the antenna 130 according to a transmission mode or a reception mode. In some embodiments, the input circuit 112 may include a matching circuit or a filter, the low-noise amplifier 113 may amplify an output signal of the input circuit 112, and the receiving circuit 114 may include a mixer for down-conversion and may further include an analog filter. In some embodiments, the transmitting circuit 115 may include a mixer for up-conversion and may further include an analog filter. The power amplifier 116 may amplify an output signal of the transmitting circuit 115, and the output circuit 117 may include a matching circuit to match load impedance or a filter. The baseband processor 120 may transmit and receive baseband signals with the transceiver 110, and may perform modulation/demodulation, encoding/decoding, channel estimation, and the like. The baseband processor 120 may be referred to as a communication processor, a modem, or the like.

As described above with reference to the drawings, due to a preferred embodiment fully differential amplifier having a high open-loop gain, a wide gain-bandwidth product (GBW), and a high slew rate; the performance of the transceiver 110 may be improved, thereby improving the quality of wireless communications. In addition, due to a preferred embodiment fully differential amplifier with reduced area and power consumption, the efficiency of the transceiver 110 and the wireless communication device 100 including the transceiver 110 may be improved. In particular, when the wireless communications device 100 is a portable device, the usability of the wireless communications device 100 may be improved by extending the operational time while powered by a battery.

While the inventive concept has been particularly shown and described with reference to embodiments thereof, it will be understood by those of ordinary skill in the pertinent art that various changes in form and details may be made therein without departing from the scope and spirit of the following claims and their equivalents.

What is claimed is:

1. A fully differential amplifier comprising:
   an input stage comprising a first amplification circuit and a second amplification circuit, one of which is configured to generate a push signal and the other of which is configured to generate a pull signal, each by amplifying a differential input signal;
   an output stage configured to generate a differential output signal based on the push signal and the pull signal; and
   a feedback circuit configured to provide common mode feedback to the first amplification circuit based on the differential output signal,
   wherein the second amplification circuit comprises a passive network for setting a common mode voltage of the push signal or the pull signal.

2. The fully differential amplifier of claim 1, wherein
the first amplification circuit comprises a first n-channel field effect transistor (NFET) pair configured to receive the differential input signal and is configured to generate the push signal, and
the second amplification circuit comprises a first p-channel field effect transistor (PFET) pair configured to receive the differential input signal and is configured to generate the pull signal.

3. The fully differential amplifier of claim 2, wherein
the second amplification circuit comprises a second NFET pair connected between the first PFET pair and a ground potential, and
the passive network comprises a first resistor and a second resistor connected in series with each other between differential output nodes of the pull signal and commonly connected to gates of the second NFET pair.

4. The fully differential amplifier of claim 3, wherein the passive network comprises:
a first resistor-capacitor (RC) circuit branch connected in parallel with the first resistor and comprising a resistor and a capacitor connected in series with each other; and
a second RC circuit branch connected in parallel with the second resistor and comprising a resistor and a capacitor connected in series with each other.

5. The fully differential amplifier of claim 2, wherein
the first amplification circuit comprises a first current source configured to provide a first bias current to the first NFET pair, and
the second amplification circuit comprises a second current source configured to provide a second bias current to the first PFET pair.

6. The fully differential amplifier of claim 1, wherein
the first amplification circuit comprises a first PFET pair configured to receive the differential input signal and is configured to generate the pull signal, and
the second amplification circuit comprises a first NFET pair configured to receive the differential input signal and is configured to generate the push signal.

7. The fully differential amplifier of claim 6, wherein
the second amplification circuit comprises a second PFET pair connected between the first NFET pair and a positive supply voltage, and
the passive network comprises a first resistor and a second resistor connected in series with each other between differential output nodes of the push signal and commonly connected to gates of the second PFET pair.

8. The fully differential amplifier of claim 7, wherein the passive network comprises:
a first resistor-capacitor (RC) circuit branch connected in parallel with the first resistor and comprising a resistor and a capacitor connected in series with each other; and
a second RC circuit branch connected in parallel with the second resistor and comprising a resistor and a capacitor connected in series with each other.

9. The fully differential amplifier of claim 6, wherein
the first amplification circuit comprises a first current source configured to provide a first bias current to the first PFET pair, and
the second amplification circuit comprises a second current source configured to provide a second bias current to the first NFET pair.

10. The fully differential amplifier of claim 1, wherein the output stage comprises:
a first PFET and a second PFET each comprising a gate configured to receive the push signal;
a first resistor-capacitor (RC) circuit branch connected between a gate and a drain of the first PFET and comprising a resistor and a capacitor connected in series with each other; and
a second RC circuit branch connected between a gate and a drain of the second PFET and comprising a resistor and a capacitor connected in series with each other.

11. The fully differential amplifier of claim 1, wherein the output stage comprises:
a first NFET and a second NFET each comprising a gate configured to receive the pull signal;
a first RC branch connected between a gate and a drain of the first NFET and comprising a resistor and a capacitor connected in series with each other; and
a second RC branch connected between a gate and a drain of the second NFET and comprising a resistor and a capacitor connected in series with each other.

12. The fully differential amplifier of claim 1, wherein the feedback circuit comprises a differential amplifier configured to amplify the differential output signal.

13. A fully differential amplifier comprising:
an input stage configured to generate a first amplified signal and a second amplified signal from a differential input signal; and
an output stage configured to generate a differential output signal based on a push-pull operation according to the first amplified signal and the second amplified signal,
wherein the input stage comprises:
a first amplification circuit configured to generate the first amplified signal based on common mode feedback generated from the differential output signal; and
a second amplification circuit configured to generate the second amplified signal having a common mode voltage which is set based on a bias and a passive network.

14. The fully differential amplifier of claim 13, wherein
the first amplification circuit comprises a first n-channel field effect transistor (NFET) pair configured to receive the differential input signal, and
the second amplification circuit comprises a first p-channel field effect transistor (PFET) pair configured to receive the differential input signal.

15. The fully differential amplifier of claim 14, wherein the second amplification circuit comprises:
a second NFET pair connected between the first PFET pair and a ground potential; and
a first resistor and a second resistor connected in series with each other between differential output nodes of the second amplified signal and commonly connected to gates of the second NFET pair.

16. The fully differential amplifier of claim 13, wherein
the first amplification circuit comprises a first PFET pair configured to receive the differential input signal, and
the second amplification circuit comprises a first NFET pair configured to receive the differential input signal.

17. The fully differential amplifier of claim 16, wherein the second amplification circuit comprises:
a second PFET pair connected between the first NFET pair and a positive supply voltage; and
a first resistor and a second resistor connected in series with each other between differential output nodes of the second amplified signal and commonly connected to gates of the second PFET pair.

18. A fully differential amplifier comprising:
an input stage comprising a first amplification circuit and a second amplification circuit configured to respectively generate a first amplified signal and a second amplified signal from a differential input signal; and an output stage configured to generate a differential output signal based on a push-pull operation according to the first amplified signal and the second amplified signal, wherein the first amplification circuit is configured to generate the first amplified signal based on common mode feedback generated from the differential output signal, and the second amplification circuit comprises a first resistor and a second resistor connected in series with each other between differential output nodes of the second amplified signal, and configured to provide a bias voltage for a common mode voltage of the second amplified signal.

19. The fully differential amplifier of claim 18, wherein the second amplification circuit comprises:

a first resistor-capacitor (RC) circuit branch connected in parallel with the first resistor and comprising a resistor and a capacitor connected in series with each other; and a second RC circuit branch connected in parallel with the second resistor and comprising a resistor and a capacitor connected in series with each other.

20. The fully differential amplifier of claim 18, wherein the output stage comprises:

a PFET pair configured to perform a push operation in response to one of the first amplified signal and the second amplified signal;

an NFET pair configured to perform a pull operation in response to the other of the first amplified signal and the second amplified signal; and at least one resistor-capacitor (RC) circuit branch connected between gate and drain of at least one transistor included in the PFET pair and the NFET pair, and comprising a resistor and a capacitor connected in series with each other.

* * * * *